(12) United States Patent
Ohtsuka et al.

(10) Patent No.: US 8,351,185 B2
(45) Date of Patent: Jan. 8, 2013

(54) ELECTRONIC COMPONENT AND MANUFACTURING METHOD THEREOF

(75) Inventors: Takashi Ohtsuka, Tokyo (JP); Kyung-Ku Choi, Tokyo (JP); Tatsuo Namikawa, Tokyo (JP); Hitoshi Yamaguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 10 days.

(21) Appl. No.: 12/853,712

(22) Filed: Aug. 10, 2010

(65) Prior Publication Data

US 2011/0044011 A1  Feb. 24, 2011

(30) Foreign Application Priority Data

Aug. 21, 2009  (JP) ................................. 2009-192589

(51) Int. Cl.
*H01G 9/00* (2006.01)
(52) U.S. Cl. ........................ 361/523; 29/25.03
(58) Field of Classification Search .................. 361/728; 156/252
See application file for complete search history.

(56) References Cited

U.S. PATENT DOCUMENTS

| | | | | |
|---|---|---|---|---|
| 5,036,020 A * | 7/1991 | Tigelaar | .......................... | 438/396 |
| 5,539,613 A * | 7/1996 | Yamamichi et al. | ........... | 361/312 |
| 5,717,233 A | 2/1998 | Fujii et al. | | |
| 5,789,303 A * | 8/1998 | Leung et al. | .................... | 438/381 |
| 6,144,547 A * | 11/2000 | Retseptor | ........................ | 361/303 |
| 6,166,424 A * | 12/2000 | Mikawa et al. | ................. | 257/535 |
| 6,380,577 B1 * | 4/2002 | Cadwallader | .................. | 257/298 |
| 6,466,430 B2 * | 10/2002 | Mido et al. | ..................... | 361/529 |
| 6,734,516 B2 * | 5/2004 | Jacksen et al. | ................. | 257/431 |
| 6,775,126 B2 * | 8/2004 | Fujii et al. | ....................... | 361/523 |
| 7,088,573 B2 * | 8/2006 | Goldberger | .................... | 361/523 |
| 7,211,517 B2 * | 5/2007 | Saito et al. | ...................... | 438/700 |
| 7,537,948 B2 * | 5/2009 | Hayashi et al. | ................... | 438/29 |
| 7,659,568 B2 * | 2/2010 | Kusano et al. | ................. | 257/307 |
| 2002/0057054 A1 * | 5/2002 | Chung et al. | ................... | 313/506 |
| 2002/0058352 A1 * | 5/2002 | Jacksen et al. | ................... | 438/54 |
| 2006/0028606 A1 * | 2/2006 | Takeguchi et al. | ............. | 349/149 |
| 2007/0153204 A1 * | 7/2007 | Kim et al. | ....................... | 349/141 |
| 2007/0158103 A1 * | 7/2007 | Wada et al. | .................... | 174/260 |
| 2007/0210866 A1 * | 9/2007 | Sato et al. | ...................... | 330/126 |

(Continued)

FOREIGN PATENT DOCUMENTS

JP          A 6-140568          5/1994

(Continued)

*Primary Examiner* — Lisa Lea Edmonds
*Assistant Examiner* — Xanthia C Cunningham
(74) *Attorney, Agent, or Firm* — Oliff & Berridge, PLC

(57) ABSTRACT

The invention provides an electronic component and a manufacturing method thereof that can achieve an improved adhesion strength when the electronic component is solder-mounted onto an external substrate and can thereby obtain considerably improved electric properties and reliabilities, etc. An electronic component, which is a capacitor 1, has: a circuit element 5a formed on a substrate 2; an electrode layer 5b connected to the circuit element 5a; passivation layers 6 and 8 that cover the electrode layer 5b; and terminal electrodes 9a and 9b connected to the electrode layer 5b via via-conductors Va and Vb formed through the passivation layers 6 and 8, the terminal electrodes 9a and 9b being formed to cover the side wall of the passivation layers 6 and 8. Since the pad electrodes 9a and 9b are formed so as to cover the passivation layers 6 and 8 across their uppermost surfaces and side walls, the area of contact between the pad electrodes 9a and 9b and the solder for solder-mounting increases, and the capacitor 1 can consequently exhibit an improved adhesion strength.

5 Claims, 14 Drawing Sheets

U.S. PATENT DOCUMENTS

| | | | |
|---|---|---|---|
| 2008/0068780 A1* | 3/2008 | Shioga et al. | 361/524 |
| 2008/0106845 A1* | 5/2008 | Kunimatsu et al. | 361/303 |
| 2008/0145996 A1* | 6/2008 | Nomura et al. | 438/396 |
| 2008/0174934 A1* | 7/2008 | Togashi | 361/303 |
| 2008/0180880 A1* | 7/2008 | Okusawa | 361/313 |
| 2008/0186650 A1* | 8/2008 | Beker et al. | 361/306.2 |
| 2008/0251285 A1* | 10/2008 | Sato et al. | 174/260 |
| 2008/0286978 A1* | 11/2008 | Chen et al. | 438/713 |
| 2009/0079070 A1* | 3/2009 | Lin et al. | 257/738 |
| 2009/0116173 A1* | 5/2009 | Shimizu et al. | 361/529 |
| 2009/0230548 A1* | 9/2009 | Park et al. | 257/737 |
| 2010/0019368 A1* | 1/2010 | Shin | 257/686 |
| 2010/0033904 A1* | 2/2010 | Niki | 361/523 |
| 2010/0096635 A1* | 4/2010 | Jung et al. | 257/59 |
| 2010/0187688 A1* | 7/2010 | Hochstenbach | 257/738 |
| 2010/0213608 A1* | 8/2010 | Lau et al. | 257/737 |
| 2010/0246089 A1* | 9/2010 | Yano et al. | 361/306.1 |

FOREIGN PATENT DOCUMENTS

JP  A 2005-191406  7/2005

* cited by examiner

FIG. 13

|  | NO INCLINATION IN HEIGHT DIRECTION | | | INCLINATION IN HEIGHT DIRECTION | | |
|---|---|---|---|---|---|---|
|  | Ls/nH | | | Ls/nH | | |
|  | 0.1GHz | 0.5GHz | 1GHz | 0.1GHz | 0.5GHz | 1GHz |
| 1ST MEASUREMENT | 0.320 | 0.320 | 0.316 | 0.350 | 0.351 | 0.347 |
| 2ND MEASUREMENT | 0.321 | 0.321 | 0.317 | 0.350 | 0.351 | 0.347 |
| 3RD MEASUREMENT | 0.321 | 0.321 | 0.347 | 0.350 | 0.352 | 0.347 |
| AVERAGE | 0.321 | 0.321 | 0.317 | 0.350 | 0.351 | 0.347 |
| STANDARD DEVIATION | 0.001 | 0.001 | 0.001 | 0.000 | 0.001 | 0.000 |

|  | NO. OF CAPACITORS MOUNTED | NO. OF CAPACITORS WITH TILT | MOUNTING RATE(%) |
|---|---|---|---|
| CONVENTIONAL CAPACITOR | 10 | 10 | 0 |
| CAPACITOR OF THIS EMBODIMENT | 10 | 0 | 100 |

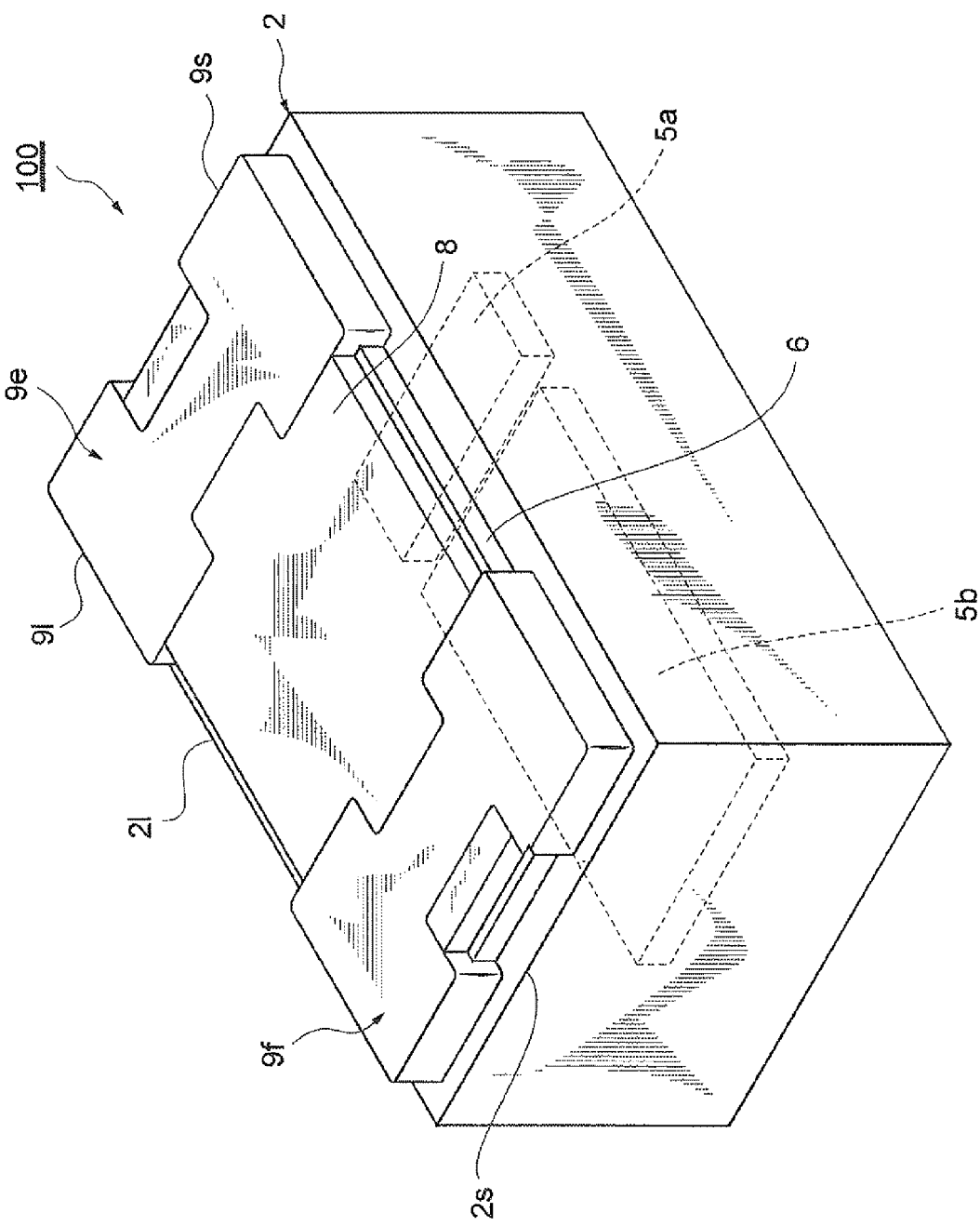

ELECTRONIC COMPONENT AND MANUFACTURING METHOD THEREOF

CROSS-REFERENCES TO RELATED APPLICATIONS

The present application relates to and claims priority from Japanese Patent Application No. 2009-192589, filed on Aug. 21, 2009, the entire disclosure of which is incorporated herein by reference.

BACKGROUND

1. Field of the Invention

The present invention relates to an electronic component and a manufacturing method thereof.

2. Description of Related Art

In recent years, together with the reduction in size of electronic devices, an increasing number of electronic device modules have been developed in which electronic components, including active components such as semiconductor devices, e.g., an IC chip (bare chip, die), for use in the electronic devices, and passive components such as a capacitor (condenser), inductor, thermistor and resistance, are mounted at a considerably higher density than before.

Electronic components mounted in such modules have various terminal electrode configurations, and known examples include the configuration of a chip resistor shown in Patent Document 1, where an external electrode is disposed to be connected to an element electrode of the electronic component and the external electrode is formed by multilayer plating so that it covers the edge portion of the top and bottom surfaces as well as the side surface of the electronic component itself. Another known example is a so-called Land Grid Array (LGA) configuration where planar pad electrodes are disposed on a substrate in a grid.

Patent document 1: Japanese Unexamined Patent Publication No. 2005-191406

SUMMARY

When mounting an electronic component having a conventional terminal electrode configuration as shown in Patent Document 1 onto an external substrate such as a wiring board by soldering (reflow soldering), the resulting solder fillet is likely to be in a flared shape, extending outward from the external electrode of the electronic component, which has been formed by plating to cover a large area including the edge portion of the top and bottom surfaces as well as the side wall of the electronic component, and occupying a considerably larger area than the area that the element itself of the electronic component occupies. Accordingly, the area that is actually needed to mount the electronic component onto the external substrate (actual mounting area) would be unduly large relative to the form of the element of the electronic component, and disposing multiple electronic components more densely with narrower spaces would be difficult, resulting in limitations to the much higher density mounting which is demanded for electronic components.

Also, if the electronic component having such a terminal electrode configuration is, for example, a capacitor (condenser), it has an upper electrode formed on a dielectric layer and an external electrode formed above them, and these electrodes are thin-film electrodes occupying a large area, resulting in unwanted floating inductance or floating capacitance in the circuit including the electronic component. Furthermore, series resistance is likely to increase. Accordingly, when the electronic component is installed in an electronic device, the electric properties or functions of the electronic device might be deteriorated by an increase of ESL (equivalent series inductance) or ESR (equivalent series resistance), which are unwanted parasitic elements for the capacitor.

Meanwhile, in an electronic component having the above-indicated LGA configuration, unlike the terminal electrode configuration shown in Patent Document 1, a terminal electrode is not extended (projected) out to the side wall of the substrate of the electronic component, and thus, the amount of solder used when soldering the electronic component having the LGA configuration onto an external substrate is relatively small; however, a solder fillet is not formed on the side wall of the substrate of the electronic component, and accordingly, the mounting strength of the electronic component (mechanical strength of adhesion to the external substrate) is likely to be considerably low relative to the case where a solder fillet is formed on the side wall. Accordingly, depending on the mounting environment, the electronic component would not be fixed in a desired state and stand straight up, or tilt in the width-direction without being sufficiently parallel to the external substrate, resulting in an increasing possibility of even lower mounting strength of the electronic component. Moreover, certain misalignment of the electronic component would occur, and this might deteriorate the electric properties or functions of the electronic device in which the electronic component is installed.

In view of the above, an object of the invention is to provide an electronic component and a manufacturing method thereof that can achieve an improved adhesion strength when the electronic component is solder-mounted onto an external substrate and thereby considerably improve the electric properties and functions of an electronic device (product) in which the electronic component is installed, namely, the reliability of the product, and that can also improve the yield in the mounting of the electronic component and thereby achieve increased productivity.

In order to solve the above-described problems, the invention provides an electronic component having: a circuit element formed on a substrate; an electrode layer connected to the circuit element; a passivation layer (insulating layer) that covers the electrode layer; and a terminal electrode disposed on a top part of the passivation layer and connected to the electrode layer via a via-conductor formed through the passivation layer, wherein one end of the terminal electrode is located on a side wall of the passivation layer.

In the electronic component having the above configuration, the terminal electrode that is connected to the circuit element (element electrode of the electronic component) formed on the substrate is formed so that it extends to the side wall of the passivation layer and covers at least part of that side wall, and thus, when soldering the electronic component onto an external substrate, a solder fillet can be formed to extend outward from the side wall of the terminal electrode. Accordingly, the area of contact between the terminal electrode of the electronic component and the solder for bonding the electronic component to the external substrate increases, and the adhesion strength of the solder-mounted electronic component can be improved. Also, since the adhesion strength of the electronic component can be improved as above, lifting of one end of the electronic component or misalignment of the electronic component can be reduced, in other words, the well-balanced adhesion of the electronic component to the external substrate can be achieved. Such improvement of the adhesion balance may be particularly apparent if the electronic component has a rectangular shape and has terminal electrodes at both ends in the longitudinal direction.

Furthermore, since one end of the terminal electrode is located at a certain part on the side wall of the passivation layer, the area of the solder fillet bonded to the electronic component can be reduced compared to the case where the terminal electrode is configured as a conventional side-face terminal formed by plating, and as a result, it is possible to dispose multiple electronic components more densely with narrower spaces, and contribute to high-density mounting by the reduction of the actual mounting area of each electronic component. Also, the manufacturing process can be simplified compared to the case of forming a conventional side-face terminal by plating. Furthermore, since such a conventional side-face terminal is not formed, unnecessary floating inductance or floating capacitance can be prevented (or reduced) in the circuit including the electronic component. In addition, although the conventional method that applies plating to the edge portion of the electronic component needs to process individual electronic components piece by piece (component by component), the electronic component according to the invention can be formed by a process of forming a plurality of element structures for the electronic components on a single substrate, forming terminal electrodes for each component, and thereafter dividing the substrate into each component by dicing, etc., and accordingly, the invention is also advantageous in that the electronic component itself can be manufactured with significantly improved productivity.

Furthermore, since a solder fillet is formed when the terminal electrode of the electronic component is bonded to the external substrate as described above, a self-alignment effect can be obtained, in other words, even if the electronic component is placed on the external substrate at a position off the desired mounting position, the electronic component can move by itself to the determined position due to the surface tension of the solder melted in the soldering.

In the above-described electronic component, it is preferable that the terminal electrode is formed such that it extends from the top part of the passivation layer along the side wall of the passivation layer, and that one end of the terminal electrode is in contact with (the top surface of) the substrate-side end of the passivation layer side wall. With this configuration, since the terminal electrode is formed to cover the entire surface of the passivation layer side wall, the area of contact between the terminal electrode of the electronic component and the solder for bonding the electronic component to the external substrate increases even more, and as a result, the adhesion strength of the solder-mounted electronic component can be even further improved.

It is also preferable that the one end of the terminal electrode reaches the substrate (if a dielectric layer is formed on the side of the substrate where a lower electrode is formed, the one end reaches the dielectric layer), and further extends along the lower electrode side surface of the substrate toward the edge portion of the substrate surface. With this configuration, since the terminal electrode is disposed extending beyond the side wall of the passivation layer toward the edge portion of the substrate, the area of contact between the terminal electrode of the electronic component and the solder for bonding the electronic component to the external substrate increases even more (the outer end wall of the solder fillet bonded to the terminal electrode is expanded outward), and as a result, the adhesion strength of the solder-mounted electronic component can be even further improved.

Also, if a part of the edge portion of the substrate top surface is left uncovered, in other words, if the edge portion of the substrate top surface (the top surface of the edge portion of the substrate) is not completely covered by the terminal electrode and exposed, this exposed portion (the exposed surface may be the surface of the passivation layer, or may be the surface of the substrate, as described above) acts as a so-called solder stopper in the soldering, and as a result, undesirable spread of solder can be reduced. Furthermore, in the case where a plurality of element structures for the electronic components is formed on one substrate, the above exposed portion can be used to ensure a margin for alignment errors in dicing.

Also, the passivation layer may be configured to include a first passivation layer formed on/above the substrate and a second passivation layer formed on/above the first passivation layer inside the area where the first passivation layer is formed; in other words, configured such that the second passivation layer is formed on the first passivation layer in a step-like form. In that case, the substrate-side surface of the second passivation layer (the boundary surface between the first and second passivation layers) is preferably smaller than the terminal electrode-side surface of the second passivation layer (the surface of the second passivation layer opposite from the first passivation layer).

In the above configuration, since the first and second passivation layers are in a step-like form and the terminal electrode is formed to cover the side wall of the passivation layer including such step-like first and second passivation layers, the boundary area where the passivation layer and the terminal electrode are in contact with each other increases compared to the case where the passivation layer does not have a step-like form. Accordingly, the passivation layer, particularly the second passivation layer can be closely adhered to the terminal electrode with improved strength, and thus, separation of the passivation layer and the terminal electrode can be prevented (or reduced).

In the above, more specifically, the side wall of the second passivation layer may be inclined, in other words, the side wall of the second passivation layer may be tapered toward the first passivation layer. With this configuration, when the terminal electrode is formed to cover the second passivation layer and extend along the inclined surface of the second passivation layer, the terminal electrode has, around the boundary area between the first and second passivation layers, a wedge-like cross section wedging into the passivation layer, and accordingly, as a result of the anchoring effect produced by the above-configured second passivation layer and terminal electrode, the passivation layer and the terminal electrode can be closely adhered to one another with even further improved strength.

BRIEF DESCRIPTION OF THE DRAWINGS

FIG. 13 is a table T1 showing, in a capacitor manufactured by a conventional method, how frequency characteristics of the capacitor vary depending on whether the capacitor has a tilt or not.

FIG. 15 is a perspective view of a capacitor 100 according to a third embodiment of the invention.

DETAILED DESCRIPTION OF PREFERRED EMBODIMENTS

Figure 1:
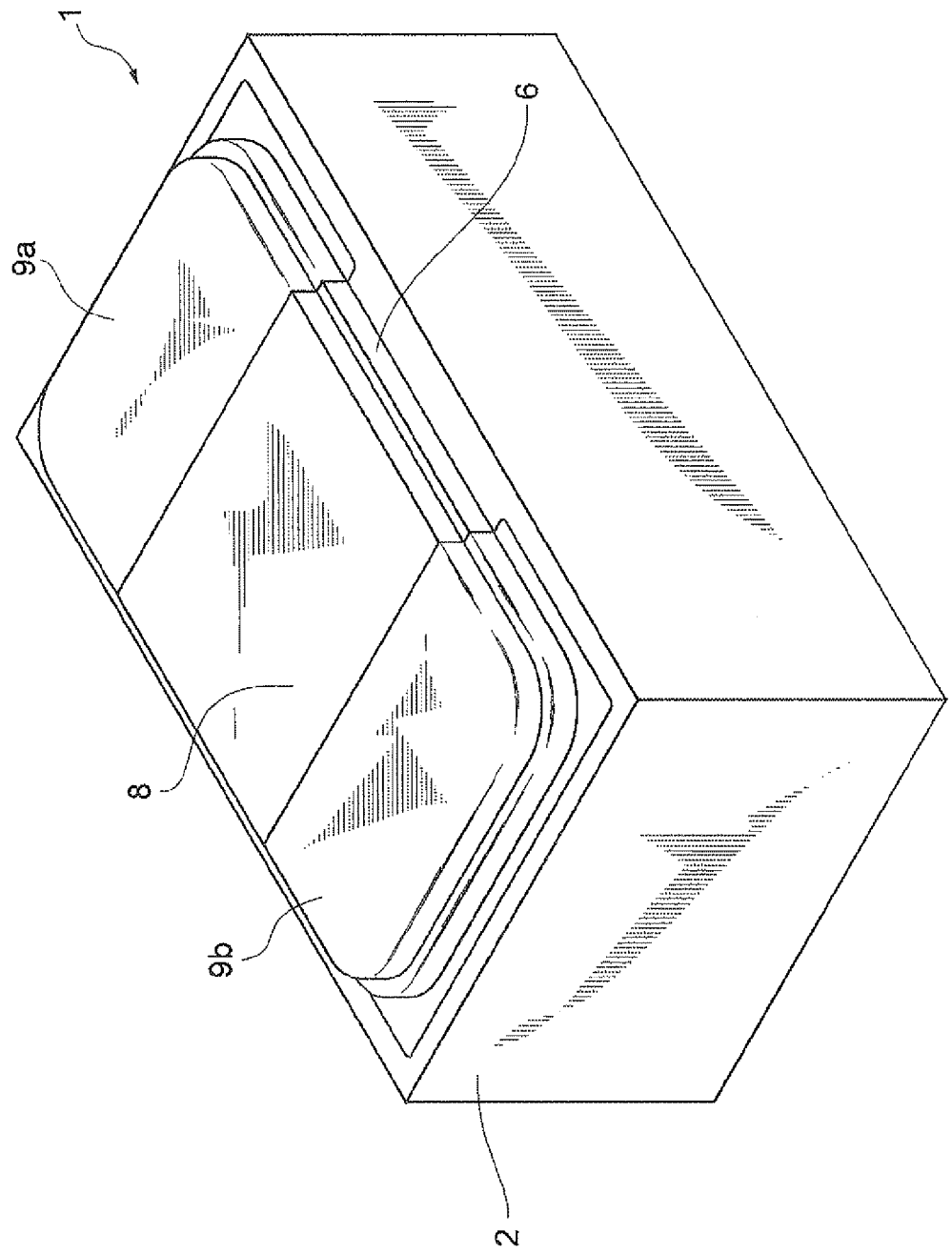
FIG. 1 is a perspective view illustrating the configuration of a capacitor, which is a preferred embodiment of the electronic component according to the invention.

Embodiments of the invention will be described below with reference to the attached drawings. In the drawings, the same components are given the same reference numerals, and any repetitive description will be omitted. The positional relationship, such as top and bottom, left and right, etc., is as shown in the drawings unless otherwise specified. The dimensional ratios are not limited to those shown in the drawings. The below embodiments are just examples for describing the invention, and the invention is not limited to those embodiments. The invention can be modified in various ways without departing from the gist of the invention.

First Embodiment

Figure 2:
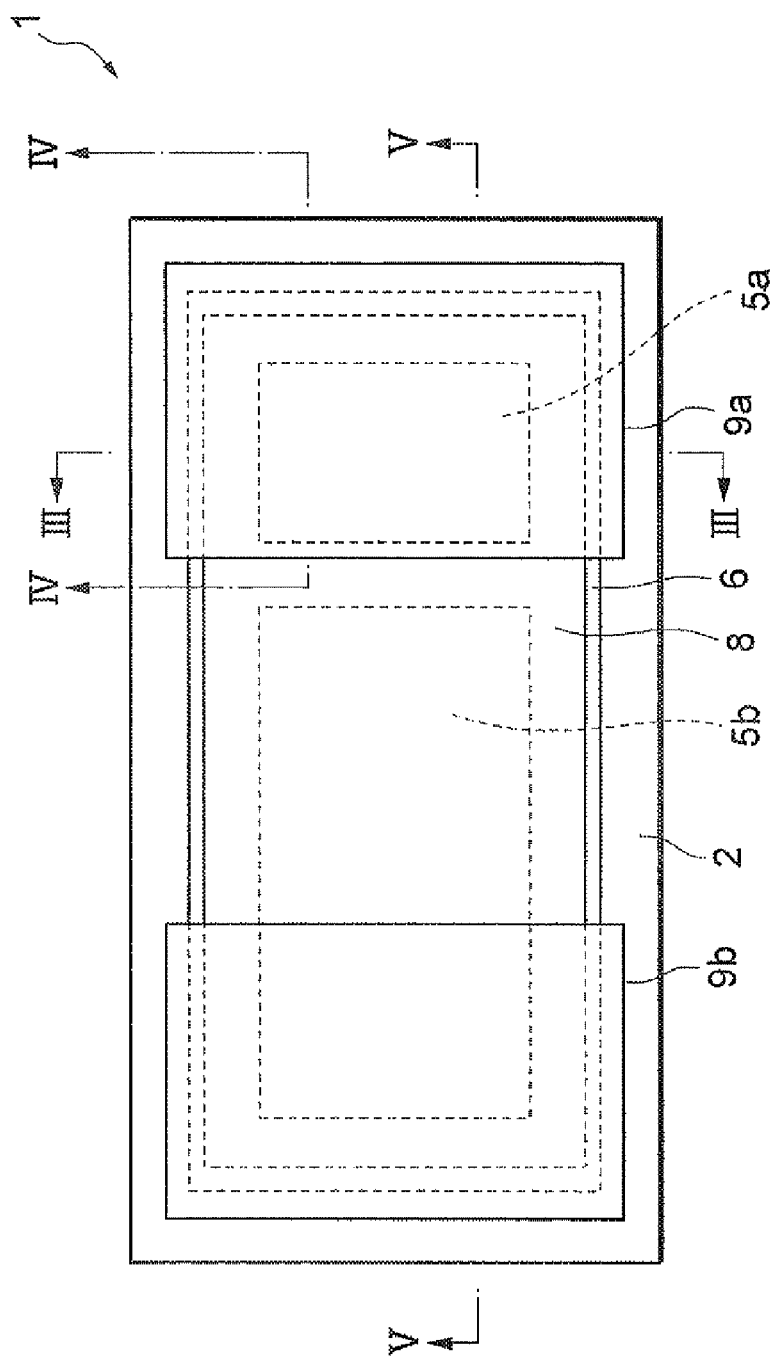
FIG. 2 is a plan view of the capacitor 1 shown in FIG. 1.
Figure 3:
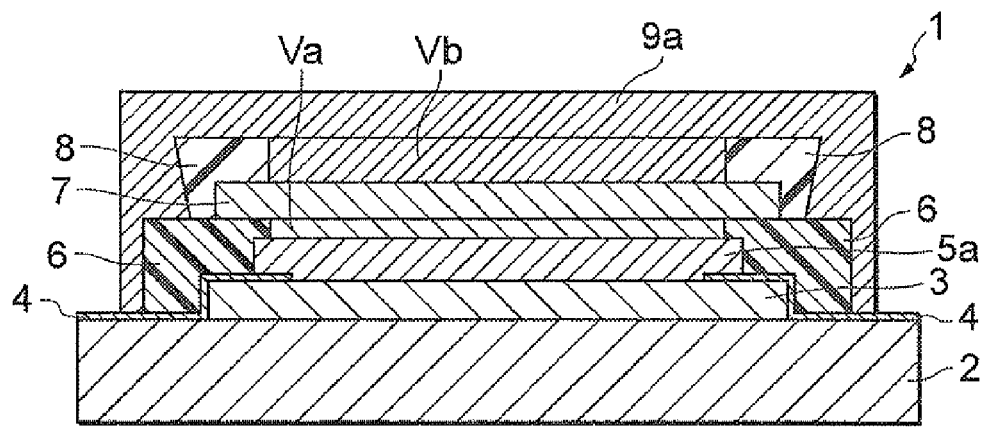
FIG. 3 is a cross-sectional view along the line in FIG. 2.
Figure 4:
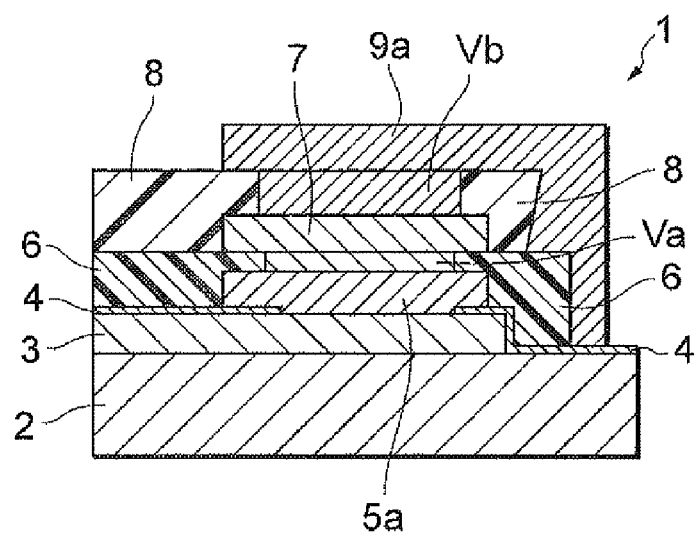
FIG. 4 is a cross-sectional view along the line IV-IV in FIG. 2.
Figure 5:
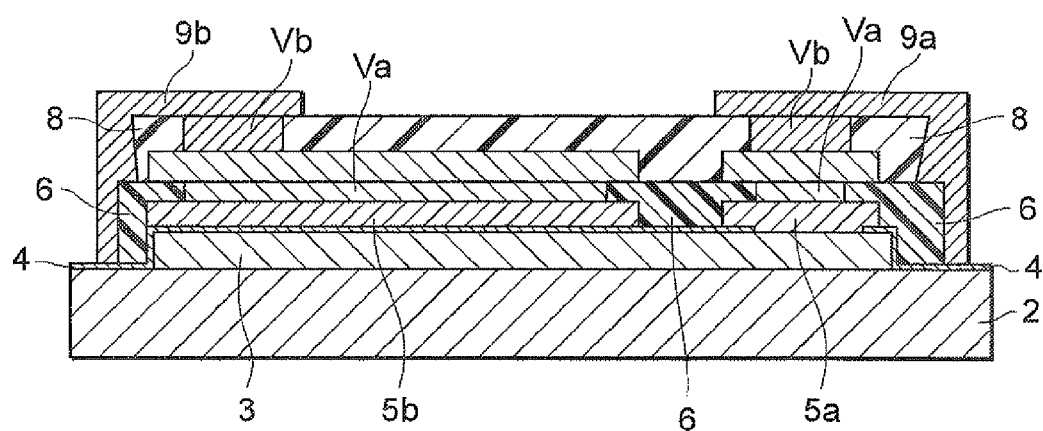
FIG. 5 is a cross-sectional view along the line V-V in FIG. 2.

FIG. 1 is a perspective view illustrating the configuration of a capacitor 1, which is a preferred embodiment of the electronic component according to the invention, and FIG. 2 is a plan view of the capacitor 1 shown in FIG. 1. FIGS. 3, 4 and 5 are cross-sectional views along the lines III-III, IV-IV and V-V, respectively, in FIG. 2.

The capacitor 1 is formed by building up, on a substrate 2 having a rectangular shape in a plan view, the following components: a lower electrode 3; a dielectric layer 4; a first electrode 5a (circuit element); a first electrode 5b (electrode layer); a first passivation layer 6 (passivation layer); a second electrode 7 (electrode layer); a second passivation layer 8 (passivation layer); and pad electrodes 9a and 9b (terminal electrode), in this order. There are no particular limitations on the material of the substrate 2, and the substrate 2 may be a metal substrate, a ceramics substrate formed of alumina, etc., a glass ceramics substrate, a glass substrate, a monocrystal substrate formed of sapphire, MgO, SrTiO, etc., or a semiconductor substrate formed of Si, SiGe, etc. Substrates that are chemically and thermally stable, cause less stress and easily keep the substrate surface smooth are used preferably. The thickness of the substrate 2 may arbitrarily be determined as required.

The lower electrode 3 is disposed on the substrate 2 in an area inside the periphery of the substrate 2, and formed of, for example, a single metal such as Ni, Ti, Cu, Au, Pt, Ag, Sn, Cr, Co, W, Pd, Mo, Ta, Ru, or Nb, or a complex metal such as an alloy containing the above metals.

The dielectric layer 4 is a thin film layer formed to cover the top surface and the side wall of the lower electrode 3, as well as a part of the top surface of the substrate 2 outside the lower electrode 3. The edge (end) portion of the dielectric layer 4 may or may not reach the edge (end) portion of the substrate 2 top surface. There are no particular limitations on the film material for the dielectric layer 4, and examples include high dielectric ceramic materials, such as $PbTiO_3$, $Pb(Zr, Ti)O_3$ (PZT), $PbNb_2O_3$, $Pb(Mg, Nb)O_3$(PMN), $BaTiO_3$, (Ba, Sr)$TiO_3$(BST), $CaTiO_3$, $ZrO_2$, $HfO_2$, $TiO_2$, $Ta_2O_6$, $Bi_4Ti_4O_{12}$, $SrBi_2Ta_2O_9$, $Al_2O_3$, $Si_3N_4$ or $SiO_2$.

The first electrode 5 is a thin film electrode formed to cover the top surface of the dielectric layer 4. The first electrode 5 is formed so that it covers the top surface of the lower electrode 3 at the center thereof and also covers the top surface of the lower electrode 3 via the dielectric layer 4 at the edge portion. Accordingly, the center of the first electrode 5 is electrically connected to the lower electrode 3, creating a configuration where electric current flows between the lower electrode 3 and the center of the first electrode 5. As with the lower electrode 3, the first electrode 5 may be formed of, for example, a single metal such as Ni, Cu, Au, Pt, Ag, Sn, Cr, Co, W, Pd, Mo, Ta, Ru or Nb, or a complex metal such as an alloy containing the above metals.

The first passivation layer 6 is formed on the first electrode 5 so that it covers not only the corners of the first electrode 5, but also the corners on the top surface of the dielectric layer 4 as well as the side wall. The material of the first passivation layer 6 is not particularly limited, and examples of the material include inorganic insulating materials such as $Al_2O_3$, $SiO_2$, or SiN, and organic insulating materials such as resins including polyimide and epoxy.

The second electrode 7 is formed on the first passivation layer 6 and it also covers the first electrode 5. As with the lower electrode 3 and the first electrode 5, the second electrode 7 may be formed of, for example, a single metal such as Ni, Cu, Au, Pt, Ag, Sn, Cr, Co, W, Pd, Mo, Ta, Ru or Nb, or a complex metal such as an alloy containing the above metals.

The second passivation layer 8 is formed as the upper layer of the second electrode 7, so that it covers the corners of the second electrode 7. As with the first passivation layer 6, the material of the second passivation layer 8 is not particularly limited, and examples of the material include inorganic materials such as $Al_2O_3$, $SiO_2$, or SiN, and insulating materials such as resins including polyimide and epoxy.

The pad electrodes 9 formed as the upper layer of the second passivation layer 8 are disposed at both ends of the capacitor 1, and connected to lower electrode 3 via a via-conductor Vb that fills an opening formed through the second passivation layer 8, a via-conductor Va that fills an opening formed through the first passivation layer 6, and the first electrode 5. The materials of the via-conductors Va and Vb and the pad electrodes 9 are not particularly limited, and as with the lower electrode 3, the first electrode 5 and the second electrode 7, they may be formed of, for example, a single metal such as Ni, Cu, Au, Pt, Ag, Sn, Cr, Co, W, Pd, Mo, Ta, Ru or Nb, or a complex metal such as an alloy containing the above metals.

Next, one example of the method for manufacturing a capacitor 1 of the above configuration will be described below. FIGS. 6-12 are process charts showing the steps for manufacturing the capacitor 1.

First, a substrate 2 is prepared, and the surface is planarized by polishing, for example, CMP. Actually, a plurality of element structures for capacitors 1 (for example, a fine structure of line/space=several μm/several μm), is formed on a single substrate 2, and lastly, the substrate is cut element by element into individual pieces (individual components) to obtain a plurality of capacitors 1, but the drawings referred to in the below description show the portion corresponding to the element structure for one capacitor 1.

Formation of Lower Electrode

Figure 6A:
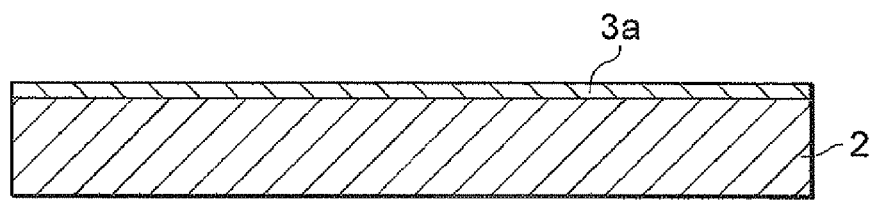
FIGS. 6A-6C are process charts showing the steps for manufacturing a capacitor 1.
Figure 6B:
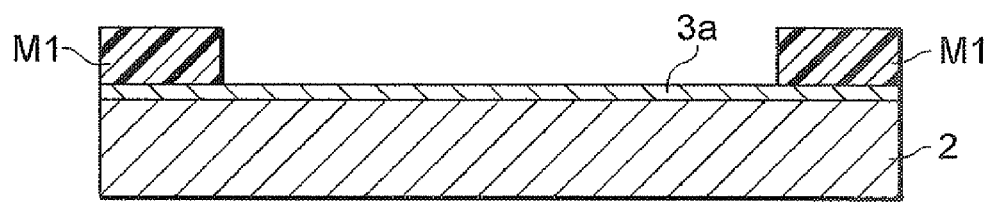

A lower electrode 3 is formed on the above substrate 2 by photolithography and plating. More specifically, for example, a base conductor layer 3*a* having a film thickness of around 0.01-1 μm is first formed on the substrate 2 as a seed layer by sputtering or non-electrolytic plating (FIG. 6A). Next, a photoresist film is deposited on the base conductor layer 3*a*, and processed by photolithography to form a resist mask M1 at the portion not corresponding to the lower electrode 3 (FIG. 6B).

Figure 6C:
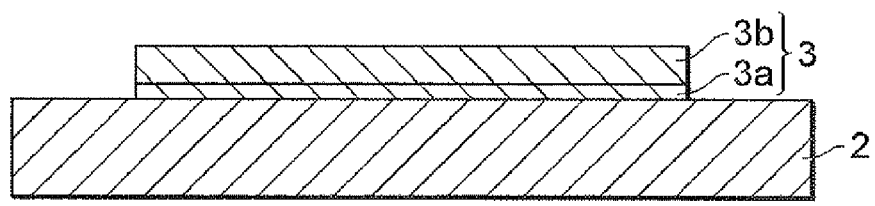

After that, using the formed resist mask M1 as a plating mask, the exposed portion of the base conductor layer is selectively electroplated (electrolytically plated) so that an electroplate conductor layer 3*b* for the formation of the lower electrode has been electrodeposited with a desired thickness. By removing the resist mask M1 and the base conductor layer 3*a* outside the electroplate conductor layer 3*b* (the base conductor layer 3*a* on which the electroplate conductor layer 3*b* has not been formed), a conductor layer 3 used as the lower electrode is obtained (FIG. 6C). In FIG. 6C, this conductor layer is given the same reference numeral as the lower electrode 3.

Formation of Dielectric Layer

Figure 7A:
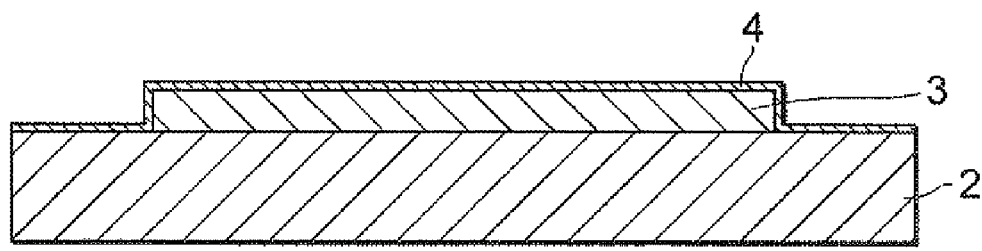
FIGS. 7A-7C are process charts showing the steps for manufacturing a capacitor 1.
Figure 7B:
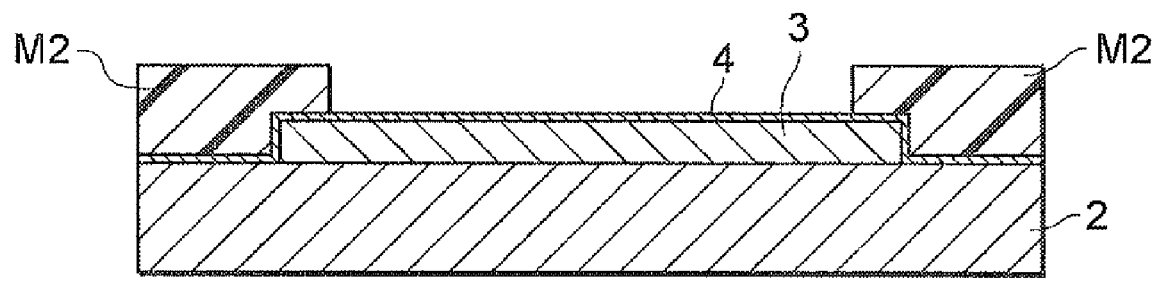
Figure 7C:
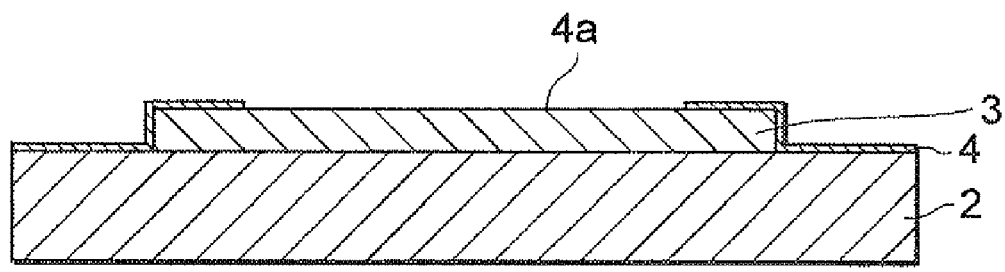

Next, a dielectric layer 4 is formed so that it covers the edge portion of the lower electrode 3 top surface as well as the side wall and also covers a part of the top surface of the substrate 2 outside the lower electrode 3. More specifically, the dielectric layer 4 is first formed on the entire surface of the lower electrode 3 and the exposed portion of the substrate 2 by PVD such as sputtering, CVD, ALD, or a solution method, etc., to have a thickness of around 0.01-1 μm (FIG. 7A). After that, a photoresist film is deposited as a resist mask M2 on the resulting dielectric layer 4, except the portion corresponding to the center of the lower electrode 3 (FIG. 7B). By using this resist mask M2 as an etch mask, a part of the dielectric layer 4 is removed by etching to form an opening 4*a*, and the resist mask M2 is thereafter removed, thereby obtaining the dielectric layer 4 having the opening 4*a* (FIG. 7C).

Formation of First Electrode

Figure 8A:
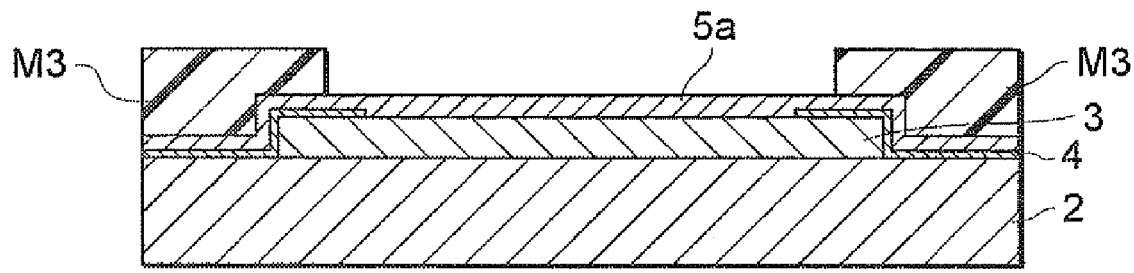
FIGS. 8A-8B are process charts showing the steps for manufacturing a capacitor 1.
Figure 8B:
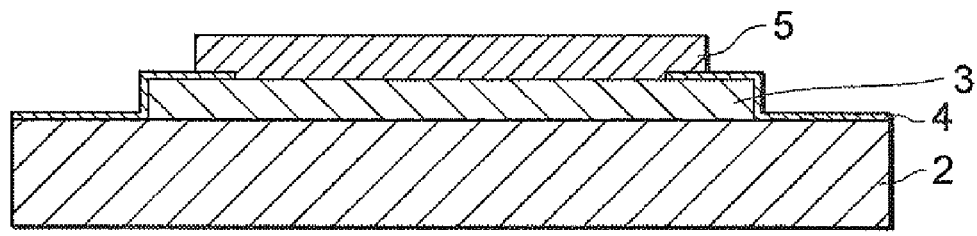

Next, a conductor layer 5 used as a first electrode is formed on the top surface of the dielectric layer 4 and the exposed portion of the lower electrode 3 shown in FIG. 8, by plating or CVD, etc. The conductor layer 5 for the first electrode is formed inside (not to extend beyond) the mounting area of the conductor layer 3 for the lower electrode. More specifically, for example, a base conductor layer 5*a* having a film thickness of around 0.01-1 μm is first formed on the dielectric layer 4 as a seed layer by sputtering or non-electrolytic plating. After that, a resist mask M3 is disposed on the base conductor layer 5*a* (FIG. 8A). Subsequently, the exposed portion of the base conductor layer 5*a*, in other words, the base conductor layer 5*a* formed on the lower electrode 3 and not covered with the resist mask M3, is selectively electroplated (electrolytically plated) so that an electroplate conductor layer for the formation of the first electrode has been electrodeposited with a desired thickness. After that, by removing the resist mask M3 and the base conductor layer outside the electroplate conductor layer, the conductor layer 5 used as the first electrode is obtained (FIG. 8B). In FIG. 8B, this conductor layer is given the same reference numeral as the first electrode 5.

Formation of First Passivation Layer

Figure 9A:
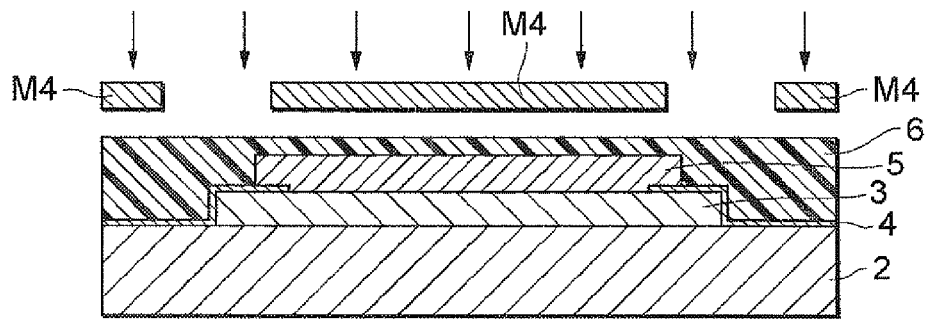
FIGS. 9A-9B are process charts showing the steps for manufacturing a capacitor 1.
Figure 9B:
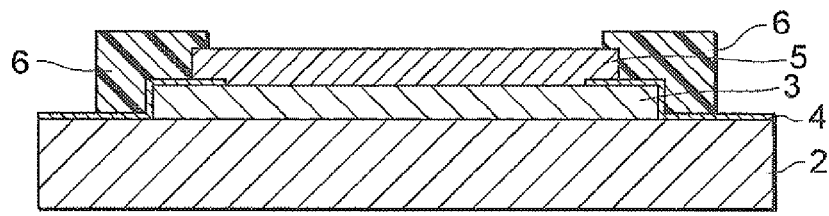

Next, in order to form a first passivation layer 6 so that it covers the edge portion of the first electrode 5, the top surface of the dielectric layer 4 formed on the lower electrode 3, the dielectric layer 4 formed on the side wall of the lower electrode 3, and the dielectric layer 4 formed on the substrate 2, for example, an uncured photo-curable resin is applied (FIG. 9A). After that, a metal mask M4 is placed over the portion where the first passivation layer 6 is not to be formed, and in this state, patterning is carried out by photolithography, thereby forming the first passivation layer 6 that covers the edge portion of the first electrode 5, the top surface of the dielectric layer 4 formed on the lower electrode 3, the dielectric layer 4 formed on the side wall of the lower electrode 3, and the dielectric layer 4 formed on the substrate 2 (FIG. 9B).

Formation of Second Electrode

Figure 10A:
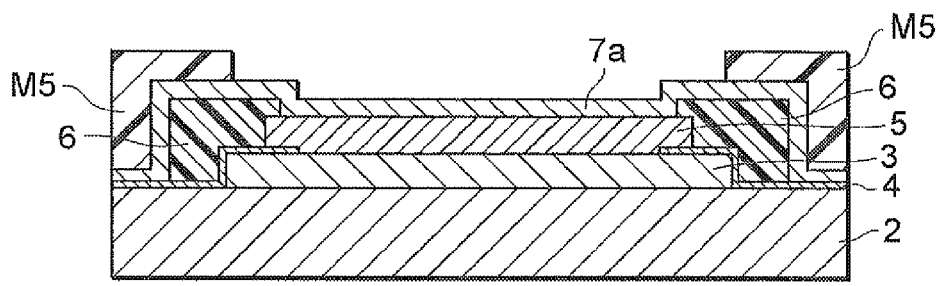
FIGS. 10A-10B are process charts showing the steps for manufacturing a capacitor 1.
Figure 10B:
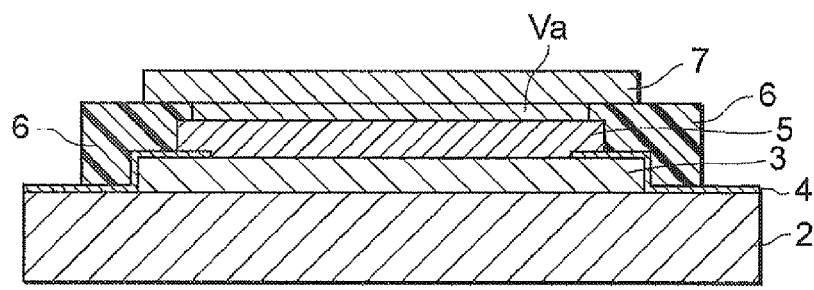

Next, a conductor layer 7 used as a second electrode is formed on the top surface of the above-obtained first passivation layer 6 and the top surface of the first electrode 5 shown in FIG. 10, by plating or CVD, etc. More specifically, a base conductor layer 7*a* having a film thickness of around 0.01-1 μm is first formed on the first passivation layer 6 and the dielectric layer 4 as a seed layer by sputtering or non-electrolytic plating. After that, a resist mask M5 is disposed on the base conductor layer 7*a* (FIG. 10A). Subsequently, the top surface of the base conductor layer 7*a* which has not been covered with the resist mask M5 is selectively electroplated (electrolytically plated) so that an electroplate conductor layer for the formation of the second electrode has been electrodeposited with a desired thickness. After that, by removing the resist mask M5 and the base conductor layer outside the electroplate conductor layer, the conductor layer 7 used as the second electrode, and a via-conductor connecting the second electrode 7 and the first electrode 5, are obtained (FIG. 10B). In FIG. 10B, this conductor layer is given the same reference numeral as the second electrode 7.

Formation of Second Passivation layer

Figure 11A:
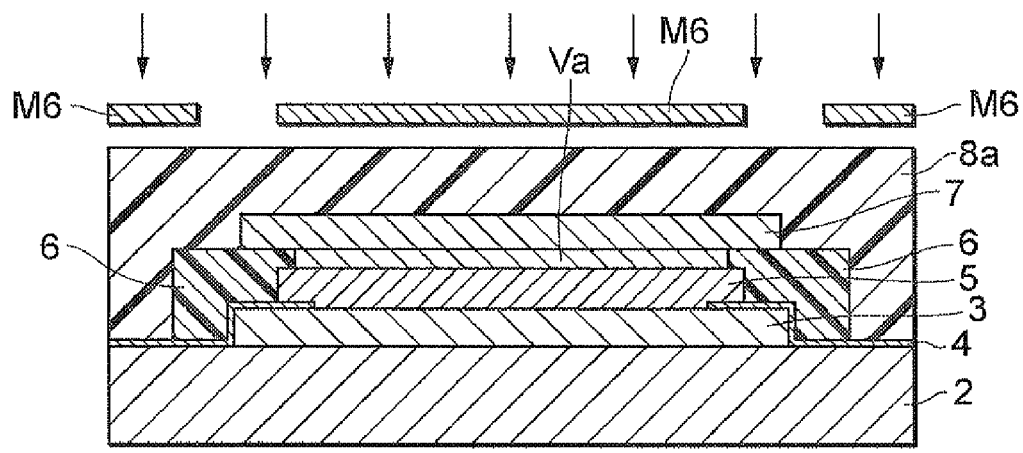
FIGS. 11A-11C are process charts showing the steps for manufacturing a capacitor 1.
Figure 11B:
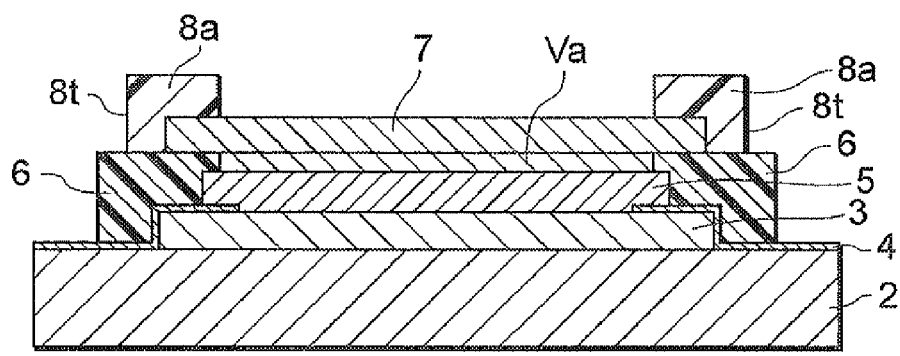
Figure 11C:
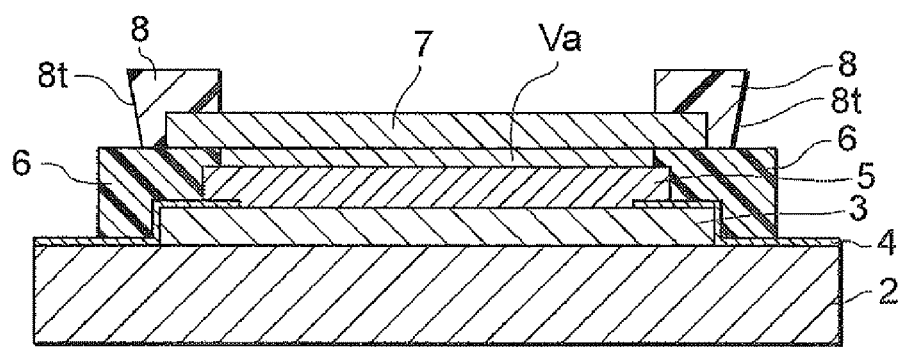

Next, a second passivation layer 8 for covering the second electrode 7 is formed. More specifically, in order that the mounting area of the second passivation layer 8 is, in a plan view, inside the mounting area of the first passivation layer 6, for example, an uncured photo-curable resin is applied to the top surface of the second electrode 7, the top surface of the first passivation layer 6 and the top surface of the dielectric layer 4 (FIG. 11A). After that, a metal mask M6 is placed over the portion where the second passivation layer 8 is not to be formed, and in this state, patterning is carried out by photolithography, thereby forming a resin layer 8*a* used as the second passivation layer on the top surface of the second electrode 7 and on the top surface of the first passivation layer 6 outside the second electrode 7 (FIG. 11B). Here, by adjusting the conditions of the photolithography, such as exposure and focusing conditions, the second passivation layer can be formed such that one side wall 8*t* of the resin layer 8*a* inclines in a tapered form from the top surface (the pad electrode 9 side) to the bottom surface (the first passivation layer 6 side) of the resin layer 8*a*, as shown in FIG. 11C.

Formation of Pad Electrode

Figure 12A:
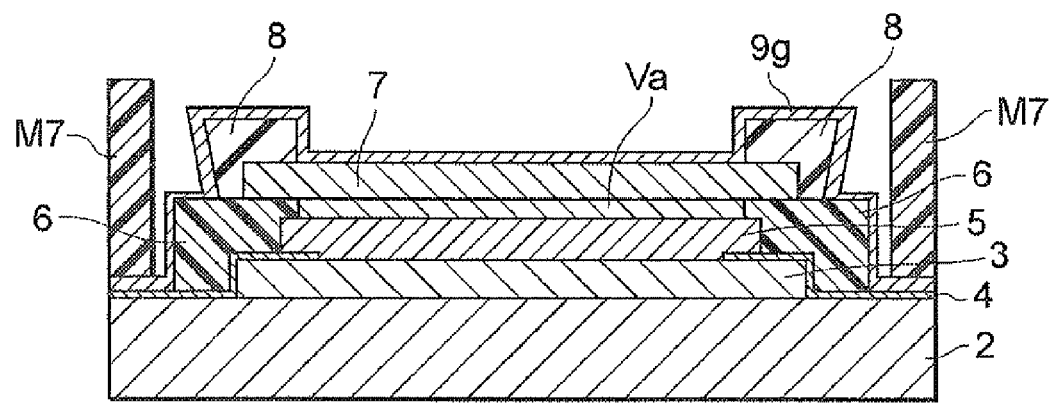
FIGS. 12A-12B are process charts showing the steps for manufacturing a capacitor 1.

Next, a pad electrode 9 is formed to cover the second passivation layer 8, the top surface of the first passivation layer 6 formed outside the second passivation layer 8 as well as the side wall, and the top surface of the dielectric layer 4 formed outside the first passivation layer. More specifically, a base conductor layer 9*g* having a film thickness of around 0.01-1 μm is formed by sputtering or non-electrolytic plating as a seed layer on the second passivation layer 8, the top surface of the first passivation layer 6 formed outside the second passivation layer 8 as well as the side wall, and the top surface of the dielectric layer 4 formed outside the first passivation layer. After that, a resist mask M7 is placed at the edge portion of the substrate 2, on the dielectric layer 4 formed outside the first passivation layer 6, so as to ensure a margin to be used when obtaining each capacitor 1 by dicing (FIG. 12A).

Figure 12B:
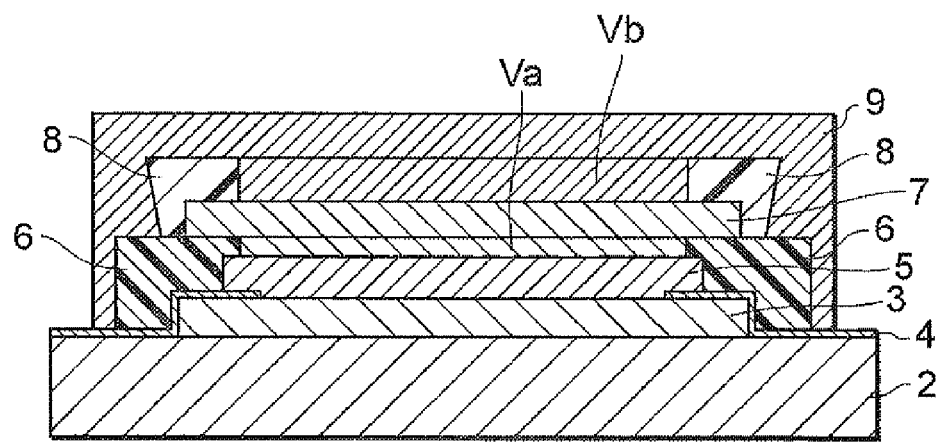

After that, the exposed portions of the base conductor layer 9g, the exposed portions being on the second passivation layer 8, the top surface of the first passivation layer 6 formed outside the second passivation layer 8 as well as the side wall, and the top surface of the dielectric layer 4 formed outside the first passivation layer 6 and not covered with the resist mask M7, are selectively electroplated (electrolytically plated), so that an electroplate conductor layer for the formation of the pad electrode has been electrodeposited with a desired thickness. After that, by removing the resist mask M7 and the base conductor layer formed outside the electroplate conductor layer, a conductor layer 9 used as the pad electrode is obtained together with a via-conductor Vb connecting the pad electrode 9 and the second electrode 7 (FIG. 12B). This conductor layer 9 used as the pad electrode is formed so as to cover not only the uppermost surface of the substrate 2 but also the side walls of the first passivation layer 6 and the second passivation layer 8, and also so as to reach the top surface of the dielectric layer 4 formed on the substrate 2. In FIG. 12B, the above conductor layer is given the same reference numeral as the pad electrode 9.

After that, although not shown in the drawings, if necessary, for example, a passivation layer for assigning an identification number for the capacitor 1 is formed between the pad electrodes 9 and in the same layer as the pad electrodes 9. The substrate 2 is thereafter cut (diced) at a specific portion between the capacitors 1. As a result, individual pieces of the capacitors 1 as shown in FIG. 1 are obtained.

In the above-described manufacturing process of the capacitor 1, since the first passivation layer 6 and the second passivation layer 8 are formed in a step-like structure, the first passivation layer 6 and the second passivation layer 8 are each in contact with the pad electrode 9 which is a conductor layer in an increased area. As a result, separation of the first passivation layer 6 and the pad electrode 9, or separation of the second passivation layer 8 and the pad electrode 9 can be prevented (reduced). Moreover, since the side end (side wall 8t) of the second passivation layer 8 is formed to incline in a tapered form from the pad electrode 9 toward the first passivation layer 6, the second passivation layer 8 and the pad electrode 9, the pad electrode 9 having a shape corresponding to the shape of the side wall, exhibit anchoring effects, resulting in the separation of the second passivation layer 8 and the pad electrode 9 being further prevented (reduced).

Also, the pad electrode 9 is formed such that it covers the side walls of the first passivation layer 6 and the second passivation layer 8 and extends outward from the first passivation layer 6 and the second passivation layer 8. In other words, the pad electrode 9 is formed on not only the top surface but also the side wall. Accordingly, a solder fillet is formed on the side wall of the pad electrode 9 as well, and thus in contact with the pad electrode 9 in an increased area, resulting in the improved adhesion strength of the solder-mounted capacitor 1. Furthermore, while the dielectric layer 4 is exposed at the edge portion of the substrate 2, the dielectric layer is covered with the pad electrode 9 except for the exposed portion, in other words, the pad electrode 9 is formed to extend to the top surface of the dielectric layer 4 outside the first passivation layer 6. Since the pad electrode 9 is formed such that the edge portion of the substrate 2 is exposed, the exposed edge portion of the substrate 2 acts as a solder stopper and provides a margin for alignment errors in dicing.

In addition, as a result of the measurement using capacitors manufactured by a conventional method, regarding how their frequency characteristics vary depending on whether they have certain tilt or not, the inventors of the present invention found that if the capacitors have certain tilt in the height (thickness) direction (or in width direction), their ESL (equivalent series inductance) values increase and the capacitor performance deteriorates, as shown in FIG. 13. However, the capacitor 1 according to this embodiment is formed such that the longitudinal ends of the capacitor 1 are held by the pad electrodes 9, and this allows the well-balanced adhesion of the capacitor 1, and reduces any increase in the ESL (equivalent series inductance) value of the mounted capacitor 1. As a result, high-density mounting is enabled, and furthermore, the productivity and reliability of electronic devices (products) in which the capacitor 1 is installed can be increased considerably.

Second Embodiment

Figures 14, 17:
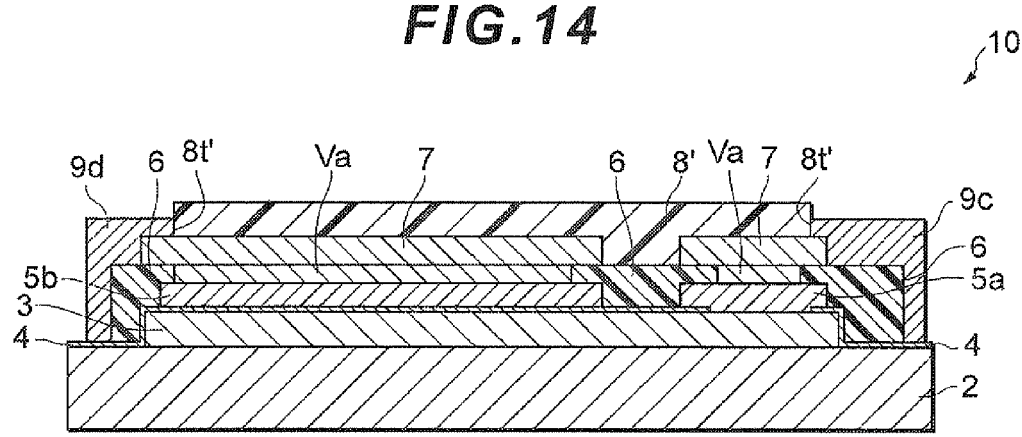
FIG. 14 is a cross-sectional view of a capacitor 10 according to a second embodiment of the invention.
FIG. 17 is a table T2 showing the result of evaluation of a capacitor 100 according to the third embodiment and a conventional capacitor, in terms of inclination.

FIG. 14 is a cross-sectional view showing the configuration of a capacitor 10 according to a second embodiment of the invention. As shown in FIG. 14, the capacitor 10 has the same configuration as the capacitor 1 of the above-described first embodiment, except that the second passivation layer 8' is formed such that the side wall 8t' has no inclination and the pad electrodes 9c and 9d are formed to cover the side wall 8t' of the second passivation layer 8', the top surface of the second electrode 7 outside the second passivation layer 8' as well as the side wall, the top surface of the first passivation layer 6 outside the second electrode 7 as well as the side wall, and the top surface of the dielectric layer 4 outside the first passivation layer 6.

In the capacitor 10 according to this embodiment, although the pad electrodes 9c and 9d do not cover the top surface of the second passivation layer 8', which is different from the above-described capacitor 1 of the first embodiment, the pad electrodes 9c and 9d extend from the side wall 8t' of the second passivation layer 8' to the top surface of the dielectric layer 4, and thus, separation of the first passivation layer 6 and the pad electrodes 9c and 9d, or separation of the second passivation layer 8' and the pad electrodes 9c and 9d can be effectively prevented (or reduced). Furthermore, since a solder fillet is formed on the side wall of the pad electrodes 9c and 9d when the capacitor is solder-mounted, the contact area of the solder with the pad electrodes 9c and 9d increases, resulting in the solder-mounted capacitor 10 exhibiting improved adhesion strength. In addition, since the pad electrodes 9c and 9d are formed so that the edge portion of the substrate 2 is exposed, the corners defined by the dielectric layer 4 and the pad electrodes 9c and 9d act as a solder stopper.

Third Embodiment

Figure 16:
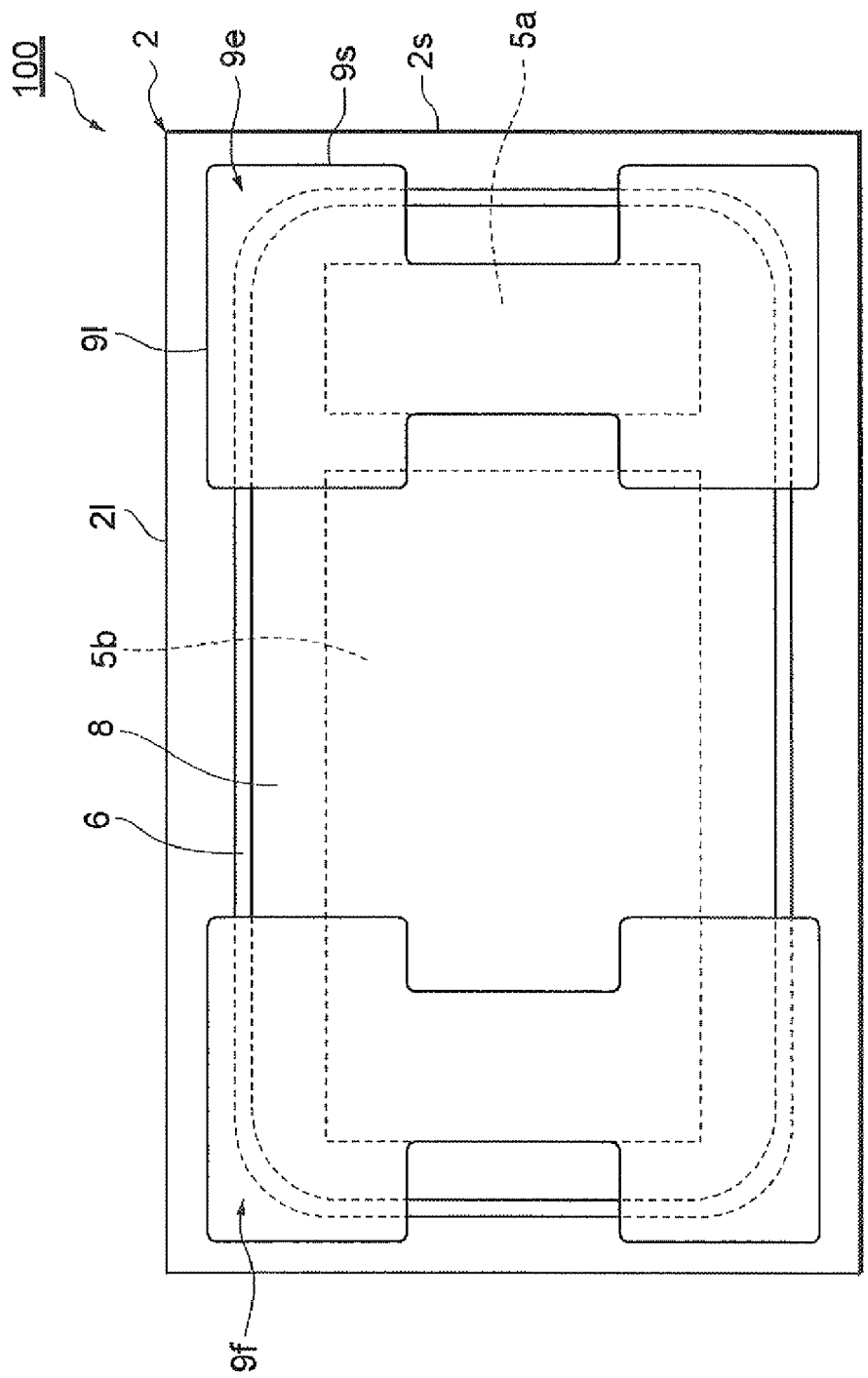
FIG. 16 is a plan view of the capacitor 100 shown in FIG. 15.

FIG. 15 is a perspective view illustrating the configuration of a capacitor 100 according to a third embodiment of the invention, and FIG. 16 is a plan view of the capacitor 100 shown in FIG. 15. As shown in the above drawings, the capacitor 100 has the same configuration as the capacitor 1 in the above-described first embodiment, except that the pad electrodes 9e and 9f are each formed to have an I-shape (or H-shape) in a plan view.

The shape of the pad electrodes 9e and 9f of this embodiment is obtained by cutting out a part of the pad electrodes 9a and 9b of the first embodiment, which are formed at both ends of the capacitor 1. More specifically, the pad electrodes 9e and 9f each have a cutout on the side along the width-direction of the capacitor 100 toward the center of the capacitor 100, while the corners of the pad electrodes 9e and 9f are left uncut.

As a result, the pad electrodes 9e and 9f have corners defined by a long side 9l along the longitudinal direction of the capacitor 100 and a short side 9s along the width direction of the capacitor 100. In general, the capacitor 100 has a substantially rectangular shape, and thus, the tension stress of solder is larger on the short side 2s than the long side 2l of the substrate 2. Accordingly, stress is applied to the capacitor 100 in its width direction, resulting in the capacitor being likely to tilt in the width direction. In this embodiment, however, since the pad electrodes 9e and 9f are formed by making a cutout in the pad electrodes 9a and 9b, so that the pad electrodes 9e and 9f each have long sides 9l in the longitudinal direction of the capacitor 100 and short sides 9s in the width direction of the capacitor 100, the difference in tension stress of solder between the long side 2l and the short side 2s of the substrate 2 can be reduced, and accordingly, tilt of the capacitor 100 can be further prevented (or reduced).

When the inventors of the present invention examined the capacitor 100 manufactured by the above-described method and a capacitor manufactured by a conventional method, by measuring the tilt of both capacitors when they are mounted on an external substrate, it was found that the capacitor 100 of this embodiment exhibited no tilt when mounted, as shown in FIG. 17. In this examination, a capacitor of the LGA configuration where pad electrodes are formed on the uppermost surface of the substrate in a grid was used as a capacitor manufactured by a conventional method.

FIG. 17 is a table T2 showing the evaluation of the capacitor 100 of this embodiment and a capacitor of the LGA configuration in terms of tilt, when ten pieces of the respective capacitors were mounted on an external substrate by applying melted solder to the pad electrodes of the respective capacitors.

In the case of the capacitors manufactured by a conventional method, tilt was found in ten (all) of the mounted capacitors, which means there was a 0% mounting rate. On the other hand, in the case of the capacitors 100 of this embodiment, no tilt was found in the ten capacitors mounted, which means there was a 100% mounting rate.

As stated above, the capacitor 100 of this embodiment can bring about the same effects as the above-described first embodiment. Furthermore, since the pad electrodes 9e and 9f are formed by making a cutout in the pad electrodes 9a and 9b of the first embodiment, so that the sides 91 formed in the longitudinal direction of the capacitor 100 are longer than the sides 9s formed in the width direction of the capacitor 100, the tension stress of solder applied to the two sides (long side 2l and short side 2s) of the substrate 2 can be well balanced. As a result, the well-balanced adhesion of the capacitor 100 can be ensured when the capacitor 100 is solder-mounted, and tilt of the capacitor 100 can be further prevented (or reduced).

Although the above embodiments are based on the premise that the pad electrodes of the capacitor are formed not to reach the edge portion of the substrate 2 in order to ensure a margin for dicing, the pad electrodes may be formed to reach the edge portion of the substrate so that the pad electrodes and the passivation layers can be closely adhered with increased strength. Also, the types of electronic components are not limited to capacitors, and may be passive components such as inductors, thermistors or resistance, or active components such as IC chips.

As described above, according to the electronic component of the invention and the manufacturing method thereof, it is possible to improve the adhesion strength of the electronic component when it is solder-mounted onto an external substrate, and thus obtain products with considerably increased reliability and productivity. Accordingly, the invention can be widely and effectively utilized in appliances, apparatuses, systems and devices which have an electronic component embedded therein, in particular, those that require smaller sizes and higher performance, and can also be utilized in the production, manufacturing, etc., thereof.

Although the electronic component of the invention is manufactured by the same steps as those of electronic components of the LGA configuration, the terminal electrode of the electronic component, which corresponds to the pad electrode of the LGA configuration, is formed to cover the uppermost surface of the substrate and at least part of the side wall of the substrate, and thus, a solder fillet is formed on the side wall of the terminal electrode as well when solder-mounting the electronic component onto an external substrate. Accordingly, the adhesion strength of the solder-mounted electronic component can be improved. Also, since the invention can bring about effects such as improving the adhesion strength of the electronic component as described above, the electric properties and functions of an electronic device (product) in which the electronic component is installed, in other words, the reliability of the product, can be considerably improved. Furthermore, the yield in the mounting of electronic components can be improved, which leads to the improved productivity.

What is claimed is:

1. An electronic component comprising:
a lower electrode formed on a top surface of a substrate, the low electrode comprising a side wall and a top surface;
a dielectric layer that covers (1) the side wall, (2) a part of the top surface of the lower electrode, and (3) a part of the top surface of the substrate around the lower electrode;
a circuit element connected to the lower electrode;
an electrode layer formed on the dielectric layer;
a passivation layer that covers the electrode layer; and
a terminal electrode disposed on a top part of the passivation layer and connected to the electrode layer via a via-conductor formed through the passivation layer, wherein:
the terminal electrode integrally extends from the top part of the passivation layer along a side wall of the passivation layer and also along an edge portion of the top surface of the substrate;
one end of the terminal electrode is located on the side wall of the passivation layer; and
a part of the edge portion is left uncovered.

2. The electronic component according to claim 1, wherein the passivation layer includes: a first passivation layer formed above the substrate; and a second passivation layer formed on the first passivation layer and inside an area where the first passivation layer is formed.

3. The electronic component according to claim 2, wherein the second passivation layer has a substrate side surface that faces the substrate and a terminal electrode side surface that faces the terminal electrode, the substrate side surface of the second passivation layer has a smaller area than the terminal electrode side surface of the second passivation layer; and the side wall of the passivation layer has a reverse-tapered surface.

4. The electronic component according to claim 1, wherein the electronic component is a capacitor.

5. A method for manufacturing an electronic component, comprising the steps of:

forming a lower electrode on a top surface of a substrate, the low electrode comprising a side wall and a top surface;

forming a dielectric layer that covers (1) the side wall, (2) a part of the top surface of the lower electrode, and (3) a part of the top surface of the substrate around the lower electrode;

forming a circuit element connected to the lower electrode;

forming an electrode layer on the dielectric layer;

forming a passivation layer that covers the electrode layer;

forming a via-conductor that extends through the passivation layer; and disposing a terminal electrode so that the terminal electrode is connected to the electrode layer via the via-conductor and integrally extends from a top part of the passivation layer along a side wall of the passivation layer and also along an edge portion of the top surface of the substrate;

wherein:

one end of the terminal electrode is located on the side wall of the passivation layer; and a part of the edge portion is left uncovered.

* * * * *